(12) United States Patent
Ethington et al.

(10) Patent No.: US 10,706,361 B1
(45) Date of Patent: Jul. 7, 2020

(54) HYBRID FEATURE SELECTION FOR PERFORMANCE PREDICTION OF FLUID CONTROL VALVES

(71) Applicant: The Boeing Company, Chicago, IL (US)

(72) Inventors: James M. Ethington, Saint Charles, MO (US); Liessman E. Sturlaugson, Creve Coeur, MO (US); Timothy J. Wilmering, Chesterfield, MO (US)

(73) Assignee: The Boeing Company, Chicago, IL (US)

( * ) Notice: Subject to any disclaimer, the term of this patent is extended or adjusted under 35 U.S.C. 154(b) by 518 days.

(21) Appl. No.: 14/966,931

(22) Filed: Dec. 11, 2015

(51) Int. Cl.
*G06N 5/04* (2006.01)
*G06F 17/50* (2006.01)
*G06N 20/00* (2019.01)
*G06F 30/20* (2020.01)

(52) U.S. Cl.
CPC .............. *G06N 5/04* (2013.01); *G06F 30/20* (2020.01); *G06N 20/00* (2019.01)

(58) Field of Classification Search
USPC .......................................................... 706/12
See application file for complete search history.

(56) References Cited

U.S. PATENT DOCUMENTS

| | | | | |
|---|---|---|---|---|
| 7,027,953 B2 * | 4/2006 | Klein | ..................... | G01H 1/006 |
| | | | | 702/182 |
| 7,260,501 B2 * | 8/2007 | Pattipatti | ............ | G05B 23/0251 |
| | | | | 702/183 |
| 7,308,385 B2 * | 12/2007 | Wegerich | ........... | G05B 23/0254 |
| | | | | 700/108 |
| 7,536,277 B2 * | 5/2009 | Pattipatti | ............ | G05B 23/0251 |
| | | | | 702/183 |

(Continued)

FOREIGN PATENT DOCUMENTS

WO      WO 01/95174      12/2001

OTHER PUBLICATIONS

Annual Conference of the Prognostics and Health Management Society 2014 Towards Performance Prognostics of a Launch Valve Glenn Shevach, Mark Blair, James Hing, Larry Venetsky, Everard Martin, John Wheelock, 1,2,3,4Naval Air Warfare Center—Aircraft Division & Naval Air Warfare Center—Aircraft Division pp. 62-69.*

(Continued)

*Primary Examiner* — Michael B Holmes
(74) *Attorney, Agent, or Firm* — DASCENZO Intellectual Property Law, P.C (57) ABSTRACT

Hybrid feature selection methods include methods of creating a predictive model for valve performance in a fleet of aircraft. Methods include qualifying a qualification dataset of valve-related parameters calculated from data collected during a first series of flights at least before and after a non-performance event of a valve. Methods include receiv- (Continued)

ing a qualified selection of the valve-related parameters and verifying a verification dataset of the qualified selection of the valve-related parameters calculated from data collected during a second series of flights. Methods include receiving a set of verified and qualified valve-related parameters and building a predictive model for valve non-performance with a training dataset of the verified and qualified valve-related parameters calculated from data collected during additional flights of the fleet.

21 Claims, 4 Drawing Sheets

(56) References Cited

U.S. PATENT DOCUMENTS

| | | | |
|---|---|---|---|
| 7,693,900 B2* | 4/2010 | Wilmering | G06F 16/367 707/713 |
| 7,953,506 B2 | 5/2011 | Tookey et al. | |
| 8,165,968 B2* | 4/2012 | Ramesh | G06Q 10/0631 705/400 |
| 8,180,750 B2* | 5/2012 | Wilmering | G06Q 10/00 707/705 |
| 8,370,280 B1 | 2/2013 | Lin et al. | |
| 8,437,904 B2* | 5/2013 | Mansouri | G07C 5/0816 244/152 |
| 8,494,824 B2* | 7/2013 | Schmitz | B60R 16/0234 703/6 |
| 8,955,365 B2* | 2/2015 | do Amaral | G05B 23/024 702/182 |
| 9,037,320 B1 | 5/2015 | Kesler et al. | |
| 9,507,342 B2* | 11/2016 | De Prosperis | G05B 23/0208 |
| 9,617,010 B2 | 4/2017 | Conrad | |
| 10,239,640 B2* | 3/2019 | Ethington | B64F 5/60 |
| 10,472,096 B2* | 11/2019 | Sturlaugson | G05B 23/0254 |
| 10,474,789 B2* | 11/2019 | Ethington | G05B 23/0283 |
| 10,497,185 B2* | 12/2019 | Hanov | G06Q 10/1097 |
| 2004/0093130 A1* | 5/2004 | Osder | B64C 27/18 701/3 |
| 2006/0089920 A1* | 4/2006 | Ramesh | G06Q 10/0631 705/400 |
| 2008/0021604 A1 | 1/2008 | Bouvier et al. | |
| 2008/0077598 A1* | 3/2008 | Wilmering | G06F 17/30734 |
| 2008/0154458 A1 | 6/2008 | Brandstetter et al. | |
| 2008/0228521 A1* | 9/2008 | Wilmering | G06F 17/3056 705/2 |
| 2009/0055339 A1* | 2/2009 | Bernard | G05B 23/0283 706/46 |
| 2009/0228160 A1 | 9/2009 | Eklund et al. | |
| 2010/0211936 A1* | 8/2010 | Schmitz | B60R 16/0234 717/136 |
| 2010/0241596 A1 | 9/2010 | Lee et al. | |
| 2012/0221193 A1 | 8/2012 | Delaye et al. | |
| 2013/0275059 A1 | 10/2013 | Bernhard et al. | |
| 2015/0324501 A1* | 11/2015 | Desell | G01C 23/00 703/2 |
| 2016/0259873 A1 | 9/2016 | Kessie et al. | |
| 2016/0300156 A1 | 10/2016 | Bowers et al. | |
| 2016/0358099 A1* | 12/2016 | Sturlaugson | G06N 20/00 |
| 2016/0364920 A1 | 12/2016 | Nelson et al. | |
| 2017/0166328 A1* | 6/2017 | Ethington | B64F 5/60 |
| 2017/0369190 A1* | 12/2017 | Ethington | G07C 5/0816 |
| 2017/0372000 A1* | 12/2017 | Ethington | G06F 17/5095 |
| 2018/0136995 A1* | 5/2018 | Sheppard | G06N 7/005 |
| 2018/0288080 A1* | 10/2018 | Keller | H04L 63/1425 |
| 2018/0346151 A1* | 12/2018 | Sturlaugson | B64F 5/60 |

OTHER PUBLICATIONS

ScienceDirect Elsevier Computers & Operations Research vol. 30, Issue 14, Dec. 2003, pp. 2097-2114 Evaluation of forecasting methods for intermittent parts demand in the field of aviation: a predictive model Adel A.Ghobbar, Chris H. Friend.*

Data-driven neural network methodology to remaining life predictions for aircraft actuator components 2004 IEEE Aerospace Conference Proceedings (IEEE Cat. No. 04TH8720) Carl S. Byington, P.E. Matthew Watson Doug Edwards Impact Technologies, LLC pp. 3581-3589.*

Journal of Aircraft vol. 45, No. 5, Sep.-Oct. 2008 Design Forum Failure-Finding Frequency for a Repairable System Subject to Hidden Failures B. Lienhardt and E. Hugues, Airbus Industries, 31060 Toulouse, France and C. Best and D. Noll Université Paul Sabatier, 31062 Toulouse, France, pp. 1804-1809.*

ScienceDirect Elsevier Reliability Engineering & System Safety vol. 164, Aug. 2017, pp. 98-109 Diagnostic and prognostic of hybrid dynamic systems: Modeling and RUL evaluation for two maintenance policies Lobna Belkacem, Zineb Simeu-Abazi, Hedi Dhouibi, Eric Gascard, Hassani Messaoud.*

Development and Application of GT-HEAT to design of the Electrically Variable Engine (EVE) David Trawick, Christopher perullo, Michael Aemstrong, Douglas Snider, Jimmy C.M. Yai, Prof. Dimitri N. Mavris American Institute of Aeronautics and Astronautics pp. 1-11.*

Lean burn combustion monitoring strategy based on data modelling, Ruowei Fu; Robert F. Harrison; Steve King; Andrew R. M 2016 IEEE Aerospace Conference, Mar. 5-12, 2016 pp. 1-11 IEEE.*

Kählert, "Specification and Evaluation of Prediction Concepts in Aircraft Maintenance," Dissertation D17, Technische Universität Darmstadt, Apr. 4, 2017.

Wei, "Prediction of the Aircraft Fault Maintenance Sorties Based on Least Squares of Linear Regression," 2012 3rd International Conference on System Science, Engineering Design and Manufacturing Informatization, pp. 223-225, Oct. 20, 2012.

R. Caruana et al., "Ensemble Selection from Libraries of Models," Proceedings of the 21st International Conference on Machine Learning, Banff, Canada, Jul. 4-8, 2004.

C. Merkwirth et al., "A Short Introduction to ENTOOL," Jan. 14, 2003, pp. 1-11. Downloaded from j-wichard.de/entool/ on Mar. 14, 2017.

U.S. Appl. No. 14/730,655, filed Jun. 4, 2015, Sturlaugson et al.

"Model Training and Tuning," downloaded from topepo.github.io/caret/training on May 4, 2015.

"The caret Package," downloaded from topepo.github.io/caret/index on May 4, 2015.

"Compare Multi-Class Classifiers: Letter Recognition," Microsoft Azure Machine Learning Gallery, downloaded from gallery.azureml.net/Experiment/a635502fc98b402a890efe21cec65b92 on May 4, 2015.

"Walkthrough Step 4: Train and Evaluate the Predictive Analytic Models," Microsoft, downloaded from azure.microsoft.com/en-us/documentation/articles/machine-learning-walkthrough-4-train-and-evaluate-models on May 4, 2015.

Hall et al., The WEKA Data Mining Software: An Update, SIGKDD Explorations, vol. 11, Issue 1, pp. 10-18, 2009.

Yan, W., Application of Random Forest to Aircraft Engine Fault Diagnosis, IMACS Multiconference on "Computational Engineering in Systems Applications" (CESA), vol. 1, pp. 468-475, Oct. 4-6, 2006.

Soares, S. et al., Comparison of a genetic algorithm and simulated annealing for automatic neural network ensemble development, Neurocomputing, vol. 121, pp. 498-511, Jun. 11, 2013.

* cited by examiner

HYBRID FEATURE SELECTION FOR PERFORMANCE PREDICTION OF FLUID CONTROL VALVES

FIELD

The present disclosure relates to hybrid feature selection for performance prediction of fluid control valves.

BACKGROUND

Aircraft and other complex apparatuses include a myriad of interoperating components. Many subsystems of components are designed for maintenance and/or repair. When such a subsystem or component performs unexpectedly (e.g., it becomes non-responsive or functions with degraded performance), the operation of the aircraft may be impacted and the aircraft may be subject to unscheduled maintenance and down time. As an example, valves in the environmental control systems of aircraft may become non-operational and may consequently result in strain on the environmental control system, fuel waste, aircraft down time, excess troubleshooting, strain on the replacement part supply, and/or potential stress on other aircraft components and systems. The consequences of an unexpected need to repair or repair of the non-performing component may be much greater than the cost, in time and resources, to repair or replace the non-performing component.

For many components, operators currently have no insight into the health of the components. Moreover, subsystems and components may behave erratically and unexpectedly well before complete non-performance. The behavior of components that may lead to non-performance may manifest as merely non-specific system degradation and related effects.

Aircraft may be available for maintenance and diagnosis only between flights. If a component performs unexpectedly during a flight, the non-performing component may require an abrupt end to the flight, necessitating a return trip for repair or at least temporary abandonment of the aircraft.

After a component has performed unexpectedly during a flight and resulted in noticeable system performance degradation, maintenance staff may troubleshoot the aircraft function and eventually identify the non-performing part as a contributor to the observed system performance degradation. The unscheduled down time and maintenance to identify the issue and to repair or replace the non-performing component may lead to resource conflicts with the aircraft. The aircraft typically is unavailable for use during troubleshooting and repair. Additionally, the unscheduled down time and maintenance may lead to strains on the scheduling of maintenance personnel due to excess time troubleshooting and identifying the issue, and may lead to strains on the supply chain for replacement parts because the need for parts may not be predictable. This reactive response to non-performing components may be inefficient when compared to scheduled maintenance or a proactive response to impending component non-performance.

SUMMARY

Hybrid feature selection methods include methods of creating a predictive model for valve performance in a fleet of aircraft. Methods include qualifying a qualification dataset of valve-related parameters calculated from data collected during a first series of flights at least before and after a non-performance event of the valve. Qualifying includes calculating and displaying the qualification dataset.

Methods include receiving a qualified selection of the valve-related parameters, generally based on a user's determination of a correlation between the non-performance event and the valve-related parameters. Methods include verifying a verification dataset of the qualified selection of the valve-related parameters calculated from data collected during a second series of flights. Verifying includes calculating and displaying the verification dataset.

Methods include receiving a set of verified and qualified valve-related parameters, generally based on a user's determination of a correlation (or lack thereof) between the qualified valve-related parameters of the qualification dataset and the corresponding valve-related parameters of the verification dataset.

Methods include building a predictive model for valve performance with a training dataset of the verified and qualified valve-related parameters calculated from data collected during additional flights of the fleet. Building includes calculating the training dataset and training the predictive model with the training dataset.

DESCRIPTION

Conventional approaches to detecting a non-performing component typically include a test to determine whether the subject component is functional (e.g., a built-in test system as typically found in aircraft). If the test indicates the component is performing unexpectedly, the operator and/or service personnel are notified of the need for repair or replacement. Generally, this type of testing provides only present, and possibly past, indications of component performance and no indication of future performance, such as impending non-performance. However, the operational characteristics of the component may indicate future behavior and/or the potential for future non-performance. Hence, the operational characteristics of the component may be utilized to reliably schedule component maintenance prior to any unexpected performance. As used herein, non-performing and non-performance include unexpected performance, degraded performance, and/or non-responsiveness. Non-performing and non-performance may include partial operation (e.g., when a component performs expectedly in some situations but not others, or when a component provides a functional but inadequate response) and complete non-operation (e.g., when a component does not respond to commands or other input, or when a component provides an unacceptable response).

Complex apparatuses like aircraft typically monitor their subsystems with sensors and generally record system operation data. While the collected data may be detailed enough to predict future component performance or non-performance, identifying valid indicators among all of the possible measured parameters and derivative parameters may be an arduous and error-prone task. Measured parameters and derivative parameters may be referred to as data features or features.

For complex systems, the amount and complexity of the operation data is overwhelming for people to efficiently analyze. Also, the raw data may be an inefficient starting point for computerized systems (e.g., machine learning systems). Computerized systems may be inefficient and/or inaccurate when given only raw data because of the large amount of uncorrelated parameters in the data. User intervention may be needed to identify and remove as much of the uncorrelated data as possible. Systems and methods of the present disclosure improve the efficiency and simplify the task of feature selection by taking a hybrid approach. A human operator is relied upon to qualify potential data features, using a limited dataset, based upon operation data and the physical expectations of component operation. Data features qualified by the operator may be used to train a predictive model of component performance (e.g., non-performance), using a comprehensive dataset. Predictive models created by the hybrid feature selection approach may be deployed to monitor component performance and reliably predict future non-performance events before the occurrence of actual non-performance, and the attendant consequences.

By accurately predicting future component performance (i.e., when to expect non-performance events), repair and/or replacement of the component may be scheduled with other maintenance and/or inspections (reducing potential downtime), flights (for example) may be flown normally (without compromised subsystems and without compromised performance), and demand for replacement parts may be predicted with some reliability. The accurate prediction of component performance also may avoid unexpected performance of the subject component and sympathetic performance responses from related components or subsystems (e.g., due to the added stress of a non-performing component in a complicated subsystem).

FIGS. 1-6 illustrate hybrid feature selection systems and methods for performance prediction of susceptible components. In general, in the drawings, elements that are likely to be included in a given embodiment are illustrated in solid lines, while elements that are optional or alternatives are illustrated in dashed lines. However, elements that are illustrated in solid lines are not essential to all embodiments of the present disclosure, and an element shown in solid lines may be omitted from a particular embodiment without departing from the scope of the present disclosure. Elements that serve a similar, or at least substantially similar, purpose are labelled with numbers consistent among the figures. Like numbers in each of the figures, and the corresponding elements, may not be discussed in detail herein with reference to each of the figures. Similarly, all elements may not be labelled or shown in each of the figures, but reference numerals associated therewith may be used for consistency. Elements, components, and/or features that are discussed with reference to one or more of the figures may be included in and/or used with any of the figures without departing from the scope of the present disclosure.

The flowcharts and block diagrams described herein illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function or functions. In some alternative implementations, the functions noted in a block may occur out of the order noted in the drawings. For example, the functions of two blocks shown in succession may be executed substantially concurrently, or the functions of the blocks may sometimes be executed in the reverse order, depending upon the functionality involved.

Figure 1:
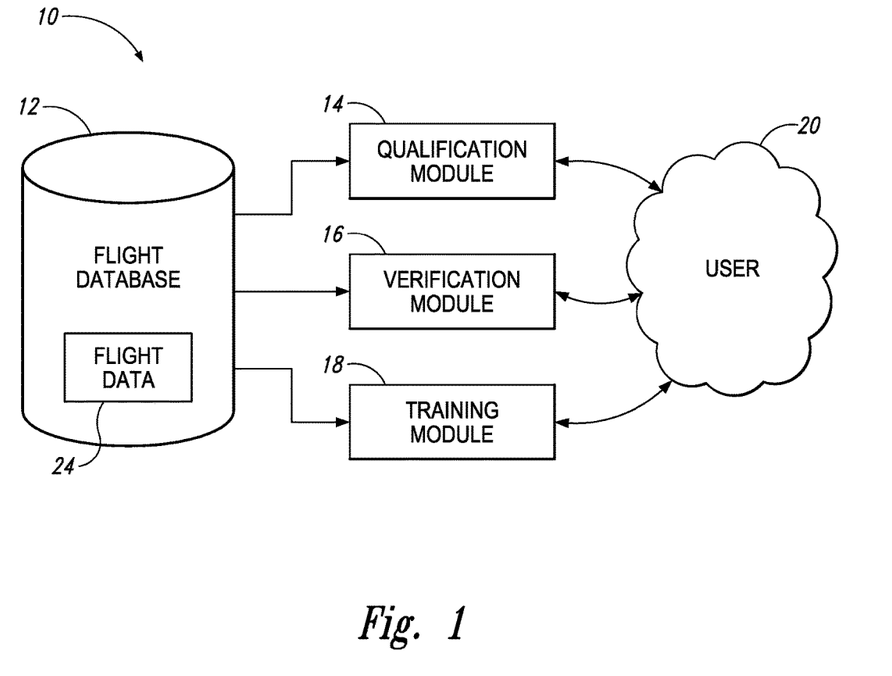
FIG. 1 is a schematic representation of a hybrid feature selection system.
Figure 6:
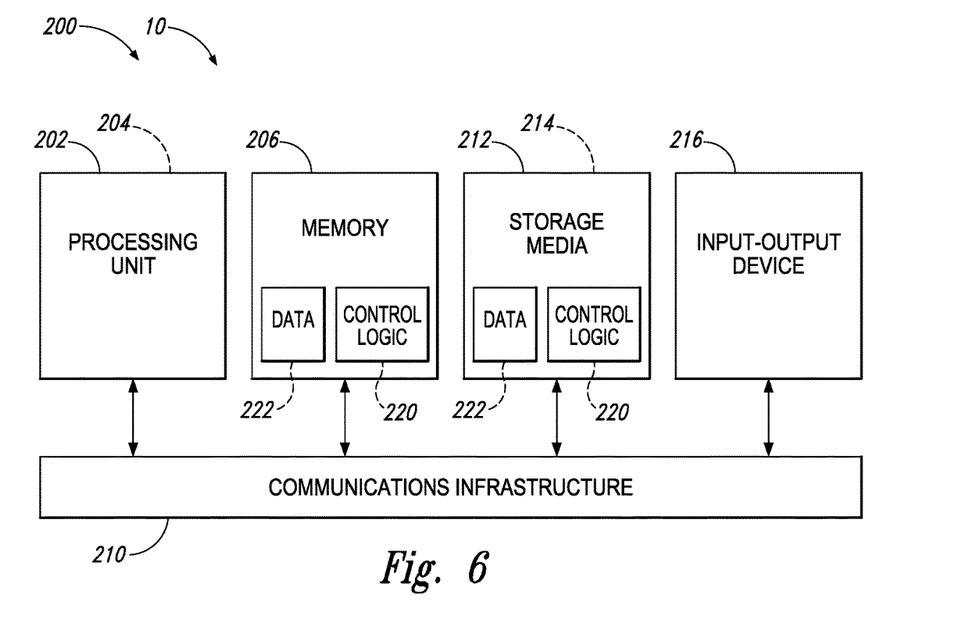
FIG. 6 is a schematic representation of a computerized system.

As schematically represented in FIG. 1, a hybrid feature selection system 10 includes several modules (e.g., instructions and/or data configured to be executed by a computerized system as described with respect to FIG. 6). These modules (which also may be referred to as agents, programs, processes, and/or procedures) may include a qualification module 14, a verification module 16, and a training module 18.

The hybrid feature selection system 10 may include and/or may utilize a flight database 12 that includes flight data 24 from one or more flights of one or more aircraft (e.g., a fleet of aircraft). The hybrid feature selection system 10 may interact with a user 20 to qualify and verify data features of the flight data 24 and to apply the identified data features to train a predictive model of component non-performance.

The hybrid feature selection system 10 may be part of a health management system and/or a health assessment system for the associated aircraft or fleet of aircraft. Additionally or alternatively, the hybrid feature selection system 10 may be utilized to create predictive models for a health management system and/or a health assessment system. The health management system and/or the health assessment system may be configured to monitor, assess, and/or indicate the operational status of one or more components of the aircraft or fleet of aircraft.

For example, the hybrid feature selection system 10 may be applied to the high temperature gaseous flow control valves and/or the high temperature gaseous shutoff valves of an environmental control system. When applied, the resulting predictive model of component performance may indicate and/or trend a non-performance event of the subject component before it occurs and also may provide a remaining useful life (RUL) estimate of the number of flights before actual non-performance is expected to occur.

Figure 2:
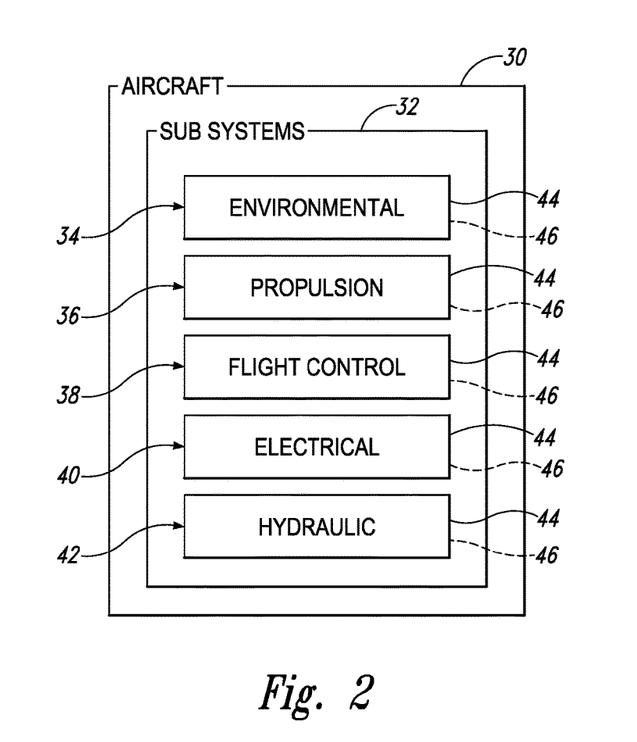
FIG. 2 is a schematic representation of an aircraft.

As indicated in FIG. 2, aircraft 30 are vehicles configured for flight and include one or more subsystems 32 that control, perform, and/or monitor one or more aspects of aircraft operation. Examples of subsystems 32, which also may be referred to as systems, include an environmental control system 34, a propulsion system 36, a flight control system 38, an electrical system 40, and a hydraulic system 42. Subsystems 32 may be a portion of other systems or subsystems of aircraft 30. For example, subsystem 32 may be a bleed air system which is a subsystem of the environmental control system 34. Subsystems 32 include one or more components 44 used to perform the function of the subsystem 32. Examples of components 44 include an engine, conduit, cabling, an electronics module, a valve, a switch, a regulator, an indicator, a pump, an actuator, and a battery. Components 44 may be referred to as parts, elements, modules, units, etc., and may be line replaceable and/or field replaceable (e.g., line replaceable units). Components 44 may be subsystems of the respective subsystem 32. Components 44 may be active and/or controlled components, i.e., components 44 may be configured to change state during flight of the aircraft 30. Components 44 may be electrical, optical, mechanical, hydraulic, fluidic, pneumatic, and/or aerodynamic components. For example, components 44 may be electro-mechanical components such as a motor, an actuator, or a valve.

If a component 44 performs unexpectedly, or otherwise is non-performing, the operation of the corresponding subsystem 32 may be impacted. Many aircraft 30 are designed to be tolerant of component non-performance. For example, aircraft 30 may include redundant subsystems 32 and/or subsystems 32 may incorporate redundant components 44. Additionally or alternatively, subsystems 32 may be designed to safely operate with less than all components 44 fully functional, e.g., by operating with reduced performance.

Subsystems 32 generally include sensors 46 configured to measure and/or monitor the performance of individual components 44, groups of components 44, and/or the subsystem 32. Additionally or alternatively, sensors 46 may measure and/or monitor the environmental condition, the condition of one or more components 44, and/or the inputs and/or outputs of the subsystem 32. Sensors 46 may be utilized in built-in testing, performance monitoring, and/or subsystem control.

Generally, sensors 46 are configured to collect data during flight of the aircraft 30. The data collected is referred to as flight data. Data may include records of environmental conditions (e.g., temperature, pressure, humidity), aircraft operation (e.g., airspeed, altitude, ground location, angle of attack), subsystem operation (actual operation), subsystem command status (expected operation), component operation (actual operation), and/or component command status (expected operation).

As an example of the effect of component non-performance, the environmental control system 34 includes components 44 that are valves to control the routing of air from the engines (which supply heated, pressurized air) to the air cycle machine (which cools the incoming air) and on into the cabin, cockpit, flight suit, and/or avionics equipment. If one of the valves of the environmental control system 34 performs unexpectedly (e.g., by opening inconsistently or incompletely when commanded), the overall environmental control system 34 may continue to operate. For example, air may be rerouted around the non-performing valve and/or the environmental control system 34 may operate at reduced performance (e.g., utilizing air from just one engine). Because the environmental control system 34 may be resilient enough to continue to operate without one or more valves, even complete non-performance or severe degradation may not be immediately noticed and repaired. Once a non-performing valve has been identified, the non-performing valve may be repaired as soon as possible, e.g., before the next flight.

Where it is hard to predict when a component 44 may perform unexpectedly, the urgency to repair a non-performing component may be heightened (e.g., to avoid having a subsystem 32 with more than one non-performing component). Further, unexpected performance of some components 44 may stress the respective subsystem 32 and may contribute to and/or cause other components to perform unexpectedly. For example, a partially or completely non-performing valve in the environmental control system 34 may lead to a frozen condenser and/or a damaged air cycle machine (both components 44 of the environmental control system 34). Hence, the valve typically is immediately repaired when non-performance is identified. The urgent repair may result in aborted flights and/or unscheduled maintenance of the aircraft 30, with the consequent unscheduled downtime, and may strain the supply chain for replacement parts. Unscheduled repair and downtime may lead to a lower availability of the aircraft and/or the lack of availability of the aircraft 30 at critical moments in time.

Though examples may refer to environmental control systems 34 and/or to aircraft 30, the systems and methods of this disclosure may be utilized with other subsystems 32 and other apparatuses. For example, the subsystem 32 may be a propulsion system 36 and the controlled component 44 may be an electronic switch. Further, systems and methods of the present disclosure may be applied to other vehicles and/or machinery. Hence, a reference to aircraft 30 may be replaced with a reference to a vehicle and/or machinery. Corresponding terms like flight may be replaced by terms like excursion and/or operation; flying may be replaced by driving, operating, and/or running.

As used herein, the term 'fleet' refers to one or more of the subject vehicles and/or machinery. A fleet may refer to all of the subject vehicles and/or machinery at a location, based at a location, used for a similar purpose, and/or used by a corporate entity (e.g., a corporation, a military unit).

For a fleet of aircraft, each aircraft 30 may be substantially identical with the same types of subsystems 32 and the same types of components 44 in the subsystems 32. As used herein, components 44 of the same type are components 44 in equivalent locations, serving equivalent functions in the different aircraft 30 and/or subsystems 32.

Figure 3:
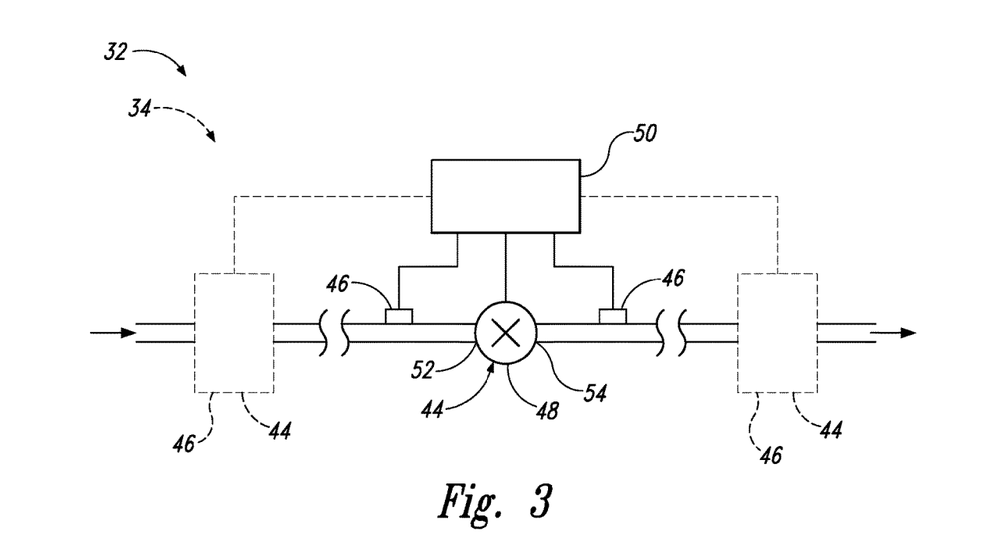
FIG. 3 is a schematic representation of an aircraft subsystem.

FIG. 3 schematically represents a subsystem 32, such as environmental control system 34, that includes a valve 48, a type of component 44. Valve 48 may be a fluidic valve, a hydraulic valve, a liquid valve, and/or a gaseous valve. In the subsystem 32, valve 48 controls flow of a fluid. Valves 48 have an upstream end 52 and a downstream end 54, with fluid flow generally flowing from the upstream end 52 to the downstream end 54.

Valve 48 may be controlled by a controller 50, which may or may not be a part of the subsystem 32. The controller 50 is configured to send a command signal to the valve 48 and/or to other components 44 to control the operation state of the valve 48. The operation state of the valve 48 may include a valve input state, a valve output state, and/or a valve flow state. For example, the operation state of the valve 48 may include a flow pressure, a flow rate, an open/closed status, a source selection, and/or a destination selection.

Subsystem 32 may include one or more sensors 46 configured to measure valve operating conditions and/or the valve operation state. Sensors 46 may be upstream of, downstream of, and/or at the valve 48. Sensors 46 may be configured to measure valve input parameters, such as input pressure, input flow rate, and/or input source, and/or may be configured to measure valve output parameters, such as output pressure, output flow rate, valve open state (e.g., open or closed), and/or output destination.

Subsystem 32 may include other components 44 upstream and/or downstream of the valve 48. Subsystem 32 may include other sensors 46 that are upstream and/or downstream of the other components 44. Valves 48 may be controlled based upon predetermined inputs, user inputs, and/or the state of other components 44, the subsystem 32 that includes the valve 48 and/or other subsystems 32. For example, valves 48 may be a part of an open or closed control loop. In a closed control loop, data from one or more sensors 46 may be utilized as feedback to adjust the command state of the valve 48 to achieve a desired output.

Valve 48 may be, for example, a flow control valve and/or a shutoff valve. In the environmental control system 34, valve 48 may be, for example, a high temperature gaseous flow control valve that is used to dynamically control the amount of pre-conditioned air that is allowed into the air cycle machine or a high temperature gaseous shutoff valve that is used to regulate the pressure of engine air entering the air cycle machine.

Returning to FIG. 1, hybrid feature selection system 10 is configured and/or programmed to analyze flight data 24 within the flight database 12. The flight database 12 is configured to search and to access the stored flight data 24. Flight data 24 is data collected during at least one flight of one or more aircraft and relates to the performance of the respective aircraft during the respective flight(s). Flight data 24 generally includes data measured by sensors in and/or associated with the aircraft. Flight data 24 may include the raw data as recorded by the sensors, processed data derived from the raw sensor data (e.g., applying an offset, an average, a filter, etc.), and/or supplemental data related to the aircraft, flight, subsystem, sensor, and/or subject component (e.g., ID number, functional state (e.g., on/off), time stamp, weather conditions, etc.).

Flight data 24 may be collected during a series of flights (one or more sequential flights), e.g., one flight, two flights, three flights, four flights, five flights, six flights, more than six flights, less than 10 flights, at least two flights, and/or at least four flights. Using flight data from a series of more than one flight may provide a more complete indicator of component performance because of the greater amount of flight data and/or because the aircraft, the subsystem, and/or the component are more likely to be subjected to a greater range of conditions and/or particular stress conditions.

Flight data 24 within the flight database 12 includes data collected for an aircraft before and after a non-performance event of a component. Flight data 24 within the flight database 12 also includes data collected for the same or different aircraft during a time window (e.g., a series of flights) in which the respective aircraft did not experience a similar component non-performance event.

Examples of flight data 24 include an indication of weight on wheels, sensor status (e.g., operating normally, degraded performance, non-responsive), subsystem settings (e.g., environmental control system mode is automatic or manual, bleed air is commanded on or off), component settings (e.g., a valve is commanded open or closed, a specified input source), sensor values, airspeed, engine throttle, a temperature, a pressure, a voltage, a current, ambient temperature, ambient pressure, compressor discharge pressure, compressor discharge temperature, bleed air pressure, and/or bleed air temperature. Flight data 24 may be collected systematically, e.g., consistently on substantially every flight, consistently in substantially every aircraft, and/or on a consistent basis (e.g., periodically). Flight data 24 relating to different sensors may be collected at different times or at substantially the same time. Flight data 24 relating to the same sensor generally forms a time series (e.g., periodic, quasi-periodic, or aperiodic).

The hybrid feature selection system 10 may be utilized to identify component parameters that potentially correlate (positive correlation or negative correlation) with impending component non-performance. Component parameters (also referred to as component-related parameters, e.g., valve-related parameters with respect to valves) are types of flight data 24 and/or data derived from flight data 24. Flight data values are the values corresponding to measurements of the component parameters. For example, a component parameter may be a gas pressure and the corresponding data may be the gas pressure value measured at a particular time and/or site within the aircraft subsystem. As another example, a component parameter may be bleed air temperature and the corresponding data may be the temperature value at a particular time in the bleed air stream of the environmental control system of the aircraft. A particular dataset may be formed from the data relating to one or more component parameters. For example, a dataset may include gas pressure values measured by a pressure sensor at a series of times during a flight of the aircraft and bleed air temperature values measured by a bleed air temperature sensor at a series of times during the same flight of the aircraft.

Component parameters may relate to specific sensors and/or specific components. For example, a specified sensor may be configured to measure a particular component parameter. As another example, component parameters may be an output parameter (e.g., output pressure, output flow rate, output destination, and a component activity state (such as an open or closed valve)), an input parameter (e.g., input pressure, input flow rate, and input source), and/or a command parameter (command pressure (also referred to as the position command and/or the pressure position command), command flow rate, source selection, a destination selection, and a command activity state) for a specified component.

Component parameters may relate to data from one or more sensors, and/or may relate to data derived from one or more sensors. For example, component parameters may be a sum, a difference, a count, and/or a statistic of one or more sensor measurements and/or data derived from one or more sensors (collectively referred to as candidate component parameters). Examples of such derived component parameters include a difference between an output parameter and a command parameter, a difference between an input parameter and an output parameter, a cumulative time that a candidate component parameter is measured within a predetermined range, a cumulative time a command parameter is asserted, a cumulative value of a candidate component parameter, an average of a candidate component parameter, a maximum of a candidate component parameter, a minimum of a candidate component parameter, a variance of a candidate component parameter, a moving-window average of a candidate component parameter (e.g., a 500-second moving-window average), a component parameter from an upstream component (upstream of the subject component), a component parameter from a downstream component (downstream of the subject component), and a control loop parameter (e.g., an error correction signal, a target value, a difference between an output parameter and a command parameter). Further, derived component parameters may be limited to and/or defined in one or more time windows, such as predetermined time windows or times in which a candidate component parameter is measured in a predetermined range. For example, a component parameter may be an operating temperature when the aircraft is at an airspeed above a predetermined limit or may be a rate of change measured in successive time periods (e.g., every 1 second).

The qualification module 14 of the hybrid feature selection system 10 is configured and/or programmed to calculate a qualification dataset based on an initial group of component parameters, to display the qualification dataset, and optionally to receive a selection of the initial group of component parameters, as described further herein with respect to the methods of the present disclosure. The qualification dataset is calculated from the initial group of component parameters from data collected during a first series of one or more flights of an aircraft. The data collected includes data from at least before a component non-performance event and after the component non-performance event. Thus, the qualification dataset may be utilized to identify potential positive correlations (indicating a non-performance event). Additionally or alternatively, the qualification dataset may be utilized to discern whether any potential correlations observed in the verification dataset are likely true or false correlations (e.g., correlated with the non-performance event or a random event), as discussed further herein. The initial group of component parameters may be user 20 selected and may represent component parameters expected to correlate (positive correlation or negative correlation) with the component non-performance event.

Upon review of the displayed qualification dataset, the user 20 may recognize potential correlations between the non-performance event and one or more of the component parameters. If the user 20 does recognize potential (positive or negative) correlations, the user 20 may select those component parameters that indicate a potential correlation (providing a selection of the component parameters to the hybrid feature selection system 10). If the user 20 does not recognize potential correlations and/or sufficient potential correlations, the user 20 may operate the qualification module 14 with a different group of component parameters in an effort to discover potential correlations and/or a sufficient number of potential correlations. The component parameters selected by the user 20 based on potential correlations are component parameters with positive correlation (indicating a non-performance event) and/or negative correlation (indicating lack of a non-performance event) to the non-performance event; however, the correlation may be a true correlation (correlating with the non-performance event and not another randomly correlated event) or a false correlation (correlating with a randomly correlated event). Generally, potential positive correlations (indicating presence of a component non-performance event) and false negative correlations are more readily identified with the qualification module 14 and the qualification dataset because the qualification dataset includes data from a component non-performance event.

The verification module 16 of the hybrid feature selection system 10 is configured and/or programmed to calculate a verification dataset based on the selection of component parameters (as received from the user 20), to display the verification dataset, and optionally to receive a set of the selection of the component parameters, as described further herein with respect to the methods of the present disclosure. The verification dataset is calculated from the selection of component parameters from data collected during a second series of one or more flights of the same or a different aircraft as the qualification dataset. The verification dataset may be calculated from the selection of parameters from data collected from more than one series of flights and/or from more than one aircraft.

The second series of flights may be selected such that no equivalent non-performance event occurred during the second series of flights. The second series of flights may be selected based at least in part on flight characteristics such as potential component stress, typical operating conditions, atypical operating conditions, harsh operating conditions, and/or similarity with flight characteristics of the first series of flights. The data collected during the second series of flights generally is not affected by a non-performance event. Thus, the verification dataset may be utilized to discern whether the potential correlations observed in the qualification dataset are likely true correlations or false correlations. Additionally or alternatively, the verification dataset may be utilized to identify potential negative correlations.

As used herein, ordinal adjectives such as "first," "second," etc. are identifiers of the referenced object and not intended to indicate a specific order, temporal or otherwise. For example, a first aircraft is an aircraft distinguished from a second aircraft and not necessarily an older aircraft. Likewise, a first series of flights is not necessarily the first series of flights ever flown by the aircraft or a series flown before the second series of flights. The first series of flights may be before, during, or after the second series of flights.

Upon review of the displayed verification dataset, the user 20 may recognize component parameter behavior that appears like the potential (positive or negative) correlations seen in the qualification dataset, hence indicating that the potential correlation is a false correlation. False positive correlations may be recognized if the data associated with a component parameter does not correspond to the physical expectations of operation of the associated component (e.g., the logical and/or empirical behavior). If the user 20 does recognize component parameter behavior that appears like a potential correlation, the user 20 may create a subset of component parameters from the selection of component parameters by deselecting the corresponding component parameter(s) and/or only selecting component parameter(s) that do not indicate a false correlation. Additionally or alternatively, the user 20 may select another selection of component parameters based upon the qualification dataset and operate the qualification module 14 and/or the verification module 16 with the new selection of component parameters. If the user 20 does not recognize component behavior that appears like a potential correlation, the user 20 may verify that the potential correlations seen in the qualification dataset are likely true correlations. The whole or the subset (together referred to as the set) of the selection of component parameters indicate likely true correlations and may be provided to the hybrid feature selection system 10 for further processing. Generally, false positive correlations (indicating presence of a component non-performance event when no non-performance is present) and potential negative correlations are more readily identified with the verification module 16 and the verification dataset because the verification dataset includes data from a component non-performance event.

The training module 18 of the hybrid feature selection system 10 is configured and/or programmed to calculate a training dataset based on the set of the selection of component parameters (as received from the user 20) and to train a predictive model for component non-performance with the training dataset, as described further herein with respect to the methods of the present disclosure. The training dataset is calculated from the set of the selection of the component parameters from data collected during multiple flights of multiple aircraft with at least one known component non-performance event, for example by utilizing the techniques of machine learning.

Figure 4:
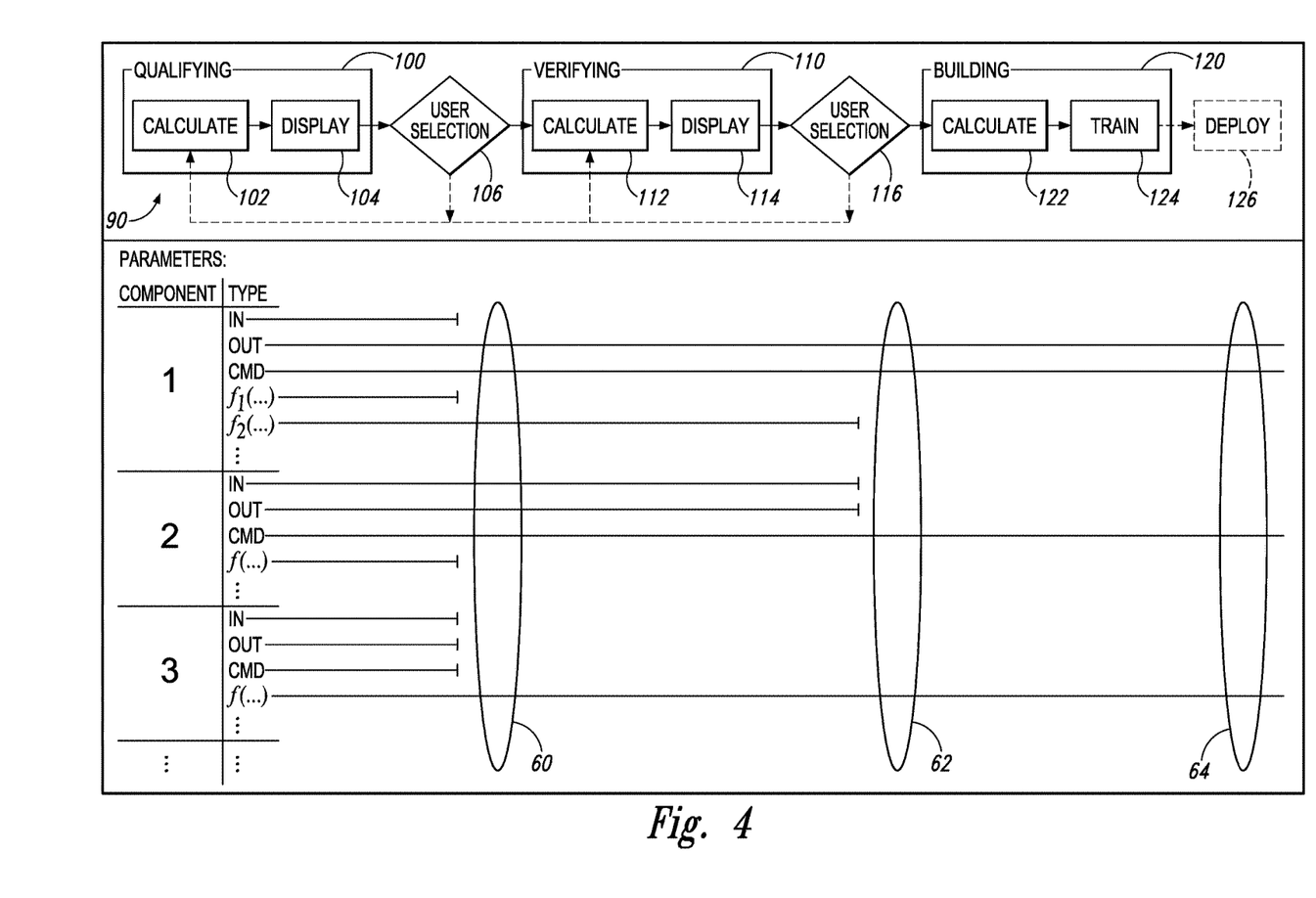
FIG. 4 is a schematic representation of methods of hybrid feature selection.

FIG. 4 schematically represents methods 90 according to the present disclosure. The upper panel illustrates an example method flow diagram. The lower panel schematically represents component parameters and the results of user selections. Methods 90 include qualifying 100 an initial group of component parameters 60, verifying 110 qualified component parameters 62, and building 120 a component performance model based on verified and qualified component parameters 64. Qualifying 100 component parameters includes calculating 102 a qualification dataset and displaying 104 (e.g., visualizing and/or presenting) the qualification dataset. Methods 90 include receiving 106 a user selection of component parameters, referred to as the qualified component parameters 62. Verifying 110 the qualified component parameters 62 includes calculating 112 a verification dataset and displaying 114 (e.g., visualizing and/or presenting) the verification dataset. Methods 90 include receiving 116 a user-selected set of the qualified component parameters 62 (the selection of component parameters), referred to as the verified and qualified component parameters 64.

Qualifying 100 is performed with data collected during a first series of one or more flights of a first aircraft that experienced a component non-performance event during the first series of flights. The qualification dataset is based on the initial group of component parameters 60. In the lower panel of FIG. 4, the initial group of component parameters 60, the qualified component parameters 62, and the verified and qualified component parameters 64 are represented as circled groups of rows of example parameters related to one or more components of the aircraft. Calculating 102 includes calculating the qualification dataset of the initial group of component parameters 60 from data collected during the first series of flights at least before and after the component non-performance event. Calculating 102 may include restricting the qualification dataset to the component parameters from data collected when one or more component inputs and/or component parameters are within at least one of a normal range, a nominal range, and an expected range. For example, where the component is a valve of an aircraft environmental control system of the first aircraft, calculating 102 may include restricting the qualification dataset to the valve-related parameters from data collected when the aircraft environmental control system is in a normal flight condition. The normal flight condition may include an aircraft weight-off-wheels condition, an aircraft airspeed greater than a predetermined threshold (e.g., 80 knots), an active air-source input state (e.g., high temperature air selected), an engine compressor discharge pressure greater than a predetermined threshold and/or within a predetermined range, a valve input pressure greater than a predetermined threshold and/or within a predetermined range, and/or substantially equal engine throttle positions (e.g., within two degrees).

Displaying 104 the qualification dataset may include creating a time domain graph of the qualification dataset. Displaying 104 may be responsive to user inputs.

Verifying 110 is performed with data collected during a second series of one or more flights of an aircraft that did not experience a component non-performance event during the second series of flights. The aircraft associated with the second series of flights may be the first aircraft or a second aircraft. Where the second series of flights is a second series of flights of the first aircraft, the first series of flights and the second series of flights are not the same. The second series of flights may include flights before or after the first series of flights (e.g., all flights are before or after the first series), and may include some of the flights of the first series of flights. The second series of flights generally has the same number of flights as the first series of flights.

Calculating 112 includes calculating the verification dataset based on the data collected during the second series of flights and the qualified component parameters 62 (the selection of component parameters) received by receiving 106. The qualified component parameters 62 include at least one, most, or optionally all, of the initial group of component parameters 60. The subject component of the second series of flights and the verification dataset is the same type of or equivalent component as the subject component of the first series of flights and the qualification dataset. That is, the component of the verification dataset may be the same component operating during an earlier series of flights, a replacement component operating during a later series of flights (after repair and/or replacement of the original component), and/or the same type of component on the second aircraft.

Receiving 106 the user selection of component parameters may be based on the user's determination of potential correlations within the qualification dataset. Optionally, for example if the user does not determine potential correlations and/or sufficient potential correlations within the qualification dataset, methods 90 may include repeating the qualifying 100 with a different group of initial component parameters 60. Methods 90 may include repeating the qualifying 100 until the user selects the qualified component parameters 62 and provides the qualified component parameters 62 at the receiving 106.

Calculating 112 may include processing the data collected during the second series of flights in substantially the same (or the same) manner as the qualification dataset. Calculating 112 may include restricting the verification dataset to the qualified component parameters 62 from data collected when one or more component inputs and/or component parameters are within at least one of a normal range, a nominal range, and an expected range. For example, where the component is a valve of an aircraft environmental control system of the corresponding first aircraft or second aircraft, calculating 112 may include restricting the verification dataset to the valve-related parameters from data collected when the aircraft environmental control system is in a normal flight condition (as described herein).

Displaying 114 the verification dataset may include creating a time domain graph of the verification dataset. Displaying 114 may be responsive to user inputs.

Receiving 116 the user-selected set of the qualified component parameters 62 may be based on the user's determination of likely true positive and/or negative correlations within the verification dataset and qualification dataset. Optionally, for example if the user does not determine likely true correlations and/or sufficient likely true correlations within the verification dataset, methods 90 may include repeating the qualifying 100 with a different group of initial component parameters 60 and/or repeating the verifying 110 with a different group of qualified component parameters 62. Methods 90 may include repeating the qualifying 100 and/or verifying 110 until the user selects the verified and qualified component parameters 64 and provides the verified and qualified component parameters 64 at the receiving 106.

Correlations may be positive correlations, in which the component parameter indicates the presence of a non-performance event, or negative correlations, in which the component parameter indicates the absence of a non-performance event. Methods 90 may include seeking, and/or the user may seek, component parameters with potential positive correlations to component non-performance events, which may boost the accuracy of true positive predictions of a predictive model (correctly predicting a non-performance event will occur), and/or component parameters with potential negative correlations to component non-performance events, which may boost the accuracy of true negative predictions of a predictive model (correctly predicting a non-performance event will not occur). A component parameter may be useful for indicating true positives, true negatives, or both. Methods 90 may include identifying potential positive correlations and verifying true positive correlations, and may include identifying potential negative correlations and verifying true negative correlations. Qualifying 100 (and the ensuing receiving 106) may be performed before (as generally described), after, and/or at least partially concurrently with verifying 110 (and the ensuing receiving 116).

For example, verifying 110 may be performed first to identify potential negative correlations and qualifying 100 may be performed subsequently to verify likely true negative correlations.

Building 120 the component performance model includes calculating 122 a training dataset based on the verified and qualified component parameters 64, and training 124 a predictive model for component performance with the training dataset.

Building 120 is performed with data collected during flights of aircraft of the fleet of aircraft. The flights may include one or more flights from the first series of flights and/or the second series of flights. The aircraft may include the first aircraft (before, during, and/or after the component non-performance event), the second aircraft, and/or other aircraft. The flights for the building 120 may include groups of series of flights, and those series of flights may all have the same number of flights and/or the same number of flights as the first series of flights and/or the second series of flights.

Calculating 122 includes calculating the training dataset based on the data collected during the as-described flights and the verified and qualified component parameters 64 (the set of the selection of component parameters) received by receiving 116. The verified and qualified component parameters 64 include at least one, most, or optionally all, of the qualified component parameters 62, provided that the verified and qualified component parameters 64 include less than all of the initial group of component parameters 60. The subject component of the training dataset is the same type or equivalent component as the subject of the qualification dataset and the verification dataset.

Calculating 122 may include processing the data collected during the flights in substantially the same (or the same) manner as the verification dataset and/or the qualification dataset. Calculating 122 may include restricting the training dataset to the verified and qualified component parameters 64 from data collected when one or more component inputs and/or component parameters are within at least one of a normal range, a nominal range, and an expected range. For example, where the component is a valve of an aircraft environmental control system, calculating 122 may include restricting the verification dataset to the valve-related parameters from data collected when the aircraft environmental control system is in a normal flight condition (as described herein).

Building 120 includes training 124 the predictive model for component performance with the training dataset, for example, by applying machine learning to the training dataset. Training 124, additionally or alternatively, may include applying a deterministic algorithm (such as linear or non-linear regression, and/or parametric modeling) to the training dataset to form the predictive model. The trained, predictive model may be referred to as the trained model (as described herein with reference to FIG. 5).

Training 124 may include supervised and/or unsupervised machine learning. The corresponding training dataset may include training signals (also referred to as labels) that may include known outcomes (e.g., component non-performance event or not) for one or more flights. Additionally or alternatively, the training 124 may include feedback based on training signals. Machine learning may be applied to regression problems (where the output data values are numeric, e.g., a voltage, a pressure, a number of cycles) and to classification problems (where the output data values are labels, classes, and/or categories, e.g., pass-fail, non-performance event type, etc.). For both types of problems, a broad array of machine learning algorithms are available, with new algorithms the subject of active research. For example, artificial neural networks, learned decision trees, and support vector machines are different classes of algorithms which may be applied to classification problems.

Methods 90 may include deploying 126 the trained, predictive model for component performance to the fleet of aircraft or another fleet of similar aircraft.

Figure 5:
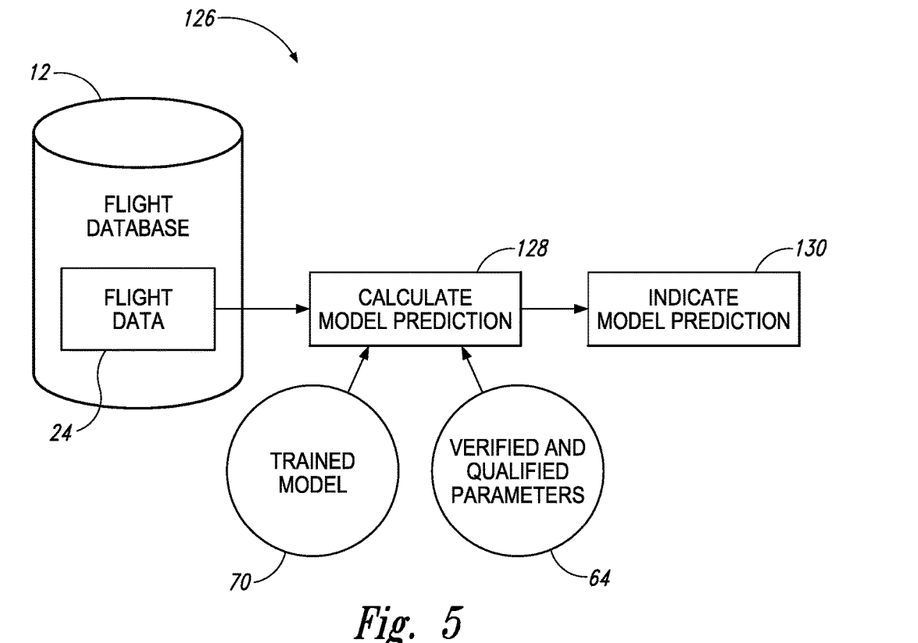
FIG. 5 is a schematic representation of methods of deploying a predictive model based on features selected according to the present disclosure.

As shown in FIG. 5, deploying 126 includes using new flight data 24 collected during flights of the associated fleet of aircraft and may include collecting the new flight data 24. The flight data 24 may be analyzed during flights and/or between flights. Flight data 24 may be stored in and/or retrieved from the flight database 12 or a flight database related to the associated fleet.

Deploying 126 includes calculating 128 (e.g., classifying) a model prediction of component non-performance based on the flight data 24, the trained model 70 (from training 124), and at least a portion of the verified and qualified component parameters 64. Calculating 128 includes calculating a testing dataset of the at least a portion of the verified and qualified component parameters 64 from the new flight data 24. Calculating 128 may include processing the new flight data 24 in the same manner as the training dataset, the verification dataset, and/or the qualification dataset.

Deploying 126 includes indicating 130 the model prediction. The model prediction may include, and/or may be, a classification of component status (e.g., operational, good, impending non-performance event, and/or non-performing) and/or an estimate of remaining useful life (e.g., number of hours before a predicted non-performance event, number of flights before a predicted non-performance event, and/or likelihood of a non-performance event during the next flight). Indicating 130 may include displaying the model prediction to the aircraft operator and/or service personnel. Indicating 130 may be integrated with a health management system and/or a health assessment system for the associated aircraft (on-platform or off-platform). The health management system and/or the health assessment system may be configured to monitor, assess, and/or indicate the operational status of one or more components of the aircraft.

FIG. 6 schematically represents a computerized system 200 that may be used to implement and/or instantiate hybrid feature selection systems 10 and components thereof, such as qualification module 14, verification module 16, training module 18, and/or flight database 12. The computerized system 200 includes a processing unit 202 operatively coupled to a computer-readable memory 206 by a communications infrastructure 210. The processing unit 202 may include one or more computer processors 204 and may include a distributed group of computer processors 204. The computerized system 200 also may include a computer-readable storage media assemblage 212 that is operatively coupled to the processing unit 202 and/or the computer-readable memory 206, e.g., by communications infrastructure 210. The computer-readable storage media assemblage 212 may include one or more non-transitory computer-readable storage media 214 and may include a distributed group of non-transitory computer-readable storage media 214.

The communications infrastructure 210 may include a local data bus, a communication interface, and/or a network interface. The communications infrastructure 210 may be configured to transmit and/or to receive signals, such as electrical, electromagnetic, optical, and/or acoustic signals.

The computerized system 200 may include one or more input-output devices 216 operatively coupled to the processing unit 202, the computer-readable memory 206, and/or the computer-readable storage media assemblage 212. Input-output devices 216 may be configured for visual, audio, and/or tactile input and/or output. Each input-output device 216 independently may be configured for only input, only output, primarily input, primarily output, and/or a combination of input and output. Examples of input-output devices 216 include monitors (e.g., video monitor), displays (e.g., alphanumeric displays, lamps, and/or LEDs), keyboards, pointing devices (e.g., mice), touch screens, speakers, buzzers, and weights.

The computerized system 200 may include a distributed group of computers, servers, workstations, etc., which each may be interconnected directly or indirectly (including by network connection). Thus, the computerized system 200 may include one or more processing units 202, computer-readable memories 206, computer-readable storage media assemblages 212, and/or input-output devices 216 that are located remotely from one another.

One or both of the computer-readable memory 206 and the computer-readable storage media assemblage 212 include control logic 220 and/or data 222. Control logic 220 (which may also be referred to as software, firmware, and/or hardware) may include instructions that, when executed by the processing unit 202, cause the computerized system 200 to perform one or more of the methods described herein. Control logic 220 may include one or more of the qualification module 14, the verification module 16, and the training module 18. Data 222 may include the flight database 12 and/or data associated with the modules and/or methods described herein.

Examples of inventive subject matter according to the present disclosure are described in the following enumerated paragraphs.

A1. A method for creating a predictive model for valve performance in a fleet of aircraft, the method comprising:

for a first aircraft of the fleet that experienced a non-performance event of a valve of the first aircraft during a first series of flights:

calculating a qualification dataset of valve-related parameters from data collected during the first series of flights at least before and after the non-performance event of the valve of the first aircraft;

displaying the qualification dataset;

receiving a selection of the valve-related parameters;

for a second series of flights of one of the first aircraft and a second aircraft of the fleet, during which the respective aircraft did not experience a non-performance event of a valve of the respective aircraft:

calculating a verification dataset of the selection of valve-related parameters from data collected during the second series of flights;

displaying the verification dataset;

receiving a set of the selection of the valve-related parameters, wherein the set of the selection of the valve-related parameters is less than all of the valve-related parameters;

calculating a training dataset of the set of the selection of the valve-related parameters from data collected during additional flights of aircraft of the fleet; and training a predictive model for valve performance with the training dataset.

A2. The method of paragraph A1, wherein the second series of flights is a second series of flights of the first aircraft and wherein each of the flights of the second series of flights is different than each of the flights of the first series of flights.

A3. The method of any of paragraphs A1-A2, wherein the valve of the respective aircraft has a valve type that is the same as a valve type of the valve of the first aircraft.

A4. The method of any of paragraphs A1-A3, wherein the first series of flights is a series of one flight, two flights, three flights, four flights, five flights, six flights, less than 10 flights, at least two flights, and/or at least four flights.

A5. The method of any of paragraphs A1-A4, wherein the second series of flights is a series of one flight, two flights, three flights, four flights, five flights, six flights, less than 10 flights, at least two flights, and/or at least four flights.

A6. The method of any of paragraphs A1-A5, wherein the second series of flights has a number of flights that is the same as a number of flights of the first series of flights.

A7. The method of any of paragraphs A1-A6, wherein the additional flights of aircraft include one or more flights of the first series of flights and/or one or more flights of the second series of flights.

A8. The method of any of paragraphs A1-A7, wherein the qualification dataset includes data collected during the non-performance event.

A9. The method of any of paragraphs A1-A8, wherein the valve-related parameters include at least one of a valve output parameter, a valve input parameter, and a valve command parameter.

A9.1. The method of paragraph A9, wherein the valve output parameter is selected from the group consisting of an output pressure, an output flow rate, a valve open state, and an output destination.

A9.2. The method of any of paragraphs A9-A9.1, wherein the valve input parameter is selected from the group consisting of an input pressure, an input flow rate, and an input source.

A9.3. The method of any of paragraphs A9-A9.2, wherein the valve command parameter is selected from the group consisting of a command pressure, a command flow rate, a command valve open state, a source selection, and a destination selection.

A10. The method of any of paragraphs A1-A9.3, wherein the valve-related parameters include at least one of a difference between a valve output parameter and a valve command parameter, a difference between a valve input parameter and a valve output parameter, a time at a valve output parameter, a time at a valve input parameter, and a time at a valve command parameter.

A11. The method of any of paragraphs A1-A10, wherein the valve-related parameters include a statistical measure of selected data collected during the corresponding flight and/or of any of the other valve-related parameters listed herein, and wherein the statistical measure is at least one of a maximum, a minimum, an average, a moving-window average, and a variance.

A12. The method of any of paragraphs A1-A11, wherein the valve-related parameters include at least one of a sum, a difference, and a count of selected data collected during a predetermined time window.

A13. The method of any of paragraphs A1-A12, wherein the valve-related parameters include a calculated value within at least one of a valve output parameter range and a valve input parameter range, wherein the calculated value is an average, a moving-window average, a variance, a sum, a difference, and a count of selected data collected during a predetermined time window.

A14. The method of any of paragraphs A1-A13, wherein the valve-related parameters include system parameters from one or more components at least one of upstream and downstream of a subject valve.

A15. The method of any of paragraphs A1-A14, wherein the valve-related parameters include a control loop parameter of a control loop that includes the valve of the first aircraft.

A16. The method of any of paragraphs A1-A15, wherein the data collected during the first series of flights was captured on a periodic basis, a quasi-periodic basis, and/or an aperiodic basis.

A17. The method of any of paragraphs A1-A16, wherein the data collected during the second series of flights was captured on a periodic basis, a quasi-periodic basis, and/or an aperiodic basis.

A18. The method of any of paragraphs A1-A17, wherein the data collected during the additional flights of aircraft of the fleet was captured on a periodic basis, a quasi-periodic basis, and/or an aperiodic basis.

A19. The method of any of paragraphs A1-A18, wherein the calculating the qualification dataset includes restricting the qualification dataset to the valve-related parameters from data collected when at least one of valve inputs and valve outputs are within at least one of a normal range, a nominal range, and an expected range.

A20. The method of any of paragraphs A1-A19, wherein the calculating the verification dataset includes restricting the verification dataset to the selection of the valve-related parameters from data collected when at least one of valve inputs and valve outputs are within at least one of a normal range, a nominal range, and an expected range.

A21. The method of any of paragraphs A1-A20, wherein the calculating the training dataset includes restricting the training dataset to the set of the selection of the valve-related parameters from data collected when at least one of valve inputs and valve outputs are within at least one of a normal range, a nominal range, and an expected range.

A22. The method of any of paragraphs A1-A21, wherein the valve of the first aircraft is a part of an aircraft environmental control system of the first aircraft, wherein the calculating the qualification dataset includes restricting the qualification dataset to the valve-related parameters from data collected when the aircraft environmental control system is in a normal flight condition, and wherein the normal flight condition includes at least one of an aircraft weight-off-wheels condition, an aircraft airspeed greater than a predetermined threshold, an active air-source input state, an engine compressor discharge pressure greater than a predetermined threshold, a valve input pressure greater than a predetermined threshold, and substantially equal engine throttle positions.

A23. The method of any of paragraphs A1-A22, wherein the valve of the respective aircraft is a part of an aircraft environmental control system of the respective aircraft, wherein the calculating the verification dataset includes restricting the verification dataset to the selection of the valve-related parameters from data collected when the aircraft environmental control system is in a normal flight condition, and wherein the normal flight condition includes at least one of an aircraft weight-off-wheels condition, an aircraft airspeed greater than a predetermined threshold, an active air-source input state, an engine compressor discharge pressure greater than a predetermined threshold, a valve input pressure greater than a predetermined threshold, and substantially equal engine throttle positions.

A24. The method of any of paragraphs A1-A23, wherein the training dataset relates to corresponding valves of the aircraft of the fleet, wherein the corresponding valves are part of aircraft environmental control systems of the aircraft of the fleet, wherein the calculating the training dataset includes restricting the training dataset to the set of the selection of the valve-related parameters from data collected when the respective aircraft environmental control system is in a normal flight condition, and wherein the normal flight condition includes at least one of an aircraft weight-off-wheels condition, an aircraft airspeed greater than a predetermined threshold, an active air-source input state, an engine compressor discharge pressure greater than a predetermined threshold, a valve input pressure greater than a predetermined threshold, and substantially equal engine throttle positions.

A25. The method of any of paragraphs A1-A24, wherein the displaying the qualification dataset includes, optionally is, visualizing and/or presenting the qualification dataset.

A26. The method of any of paragraphs A1-A25, wherein the displaying the verification dataset includes, optionally is, visualizing and/or presenting the verification dataset.

A27. The method of any of paragraphs A1-A26, wherein the displaying the qualification dataset includes creating a time domain graph of the qualification dataset.

A28. The method of any of paragraphs A1-A27, wherein the displaying the verification dataset includes creating a time domain graph of the verification dataset.

A29. The method of any of paragraphs A1-A28, wherein the displaying the qualification dataset includes displaying responsive to user inputs.

A30. The method of any of paragraphs A1-A29, wherein the displaying the verification dataset includes displaying responsive to user inputs.

A31. The method of any of paragraphs A1-A30, wherein the receiving the selection of the valve-related parameters is receiving from the user the selection.

A32. The method of any of paragraphs A1-A31, wherein the receiving the set of the selection is receiving from the user the set of the selection.

A33. The method of any of paragraphs A1-A32, wherein the selection of the valve-related parameters is less than all valve-related parameters.

A34. The method of any of paragraphs A1-A33, wherein the set of the selection of the valve-related parameters is less than all of the selection of the valve-related parameters.

A35. The method of any of paragraphs A1-A34, wherein the selection of valve-related parameters is a selection based on a user's determination of a correlation between the non-performance event and the valve-related parameters.

A36. The method of any of paragraphs A1-A35, wherein the set of the selection of valve-related parameters is a set selected from the selection based on a user's determination of a correlation between the selection of the valve-related parameters of the qualification dataset and the corresponding valve-related parameters of the verification dataset.

A37. The method of any of paragraphs A1-A36, wherein the set of the selection of valve-related parameters is a set selected from the selection based upon a user's determination of a lack of a correlation between the selection of the valve-related parameters of the qualification dataset and the corresponding valve-related parameters of the verification dataset.

A38. The method of any of paragraphs A1-A37, wherein training the predictive model includes applying machine learning to the training dataset.

A39. The method of any of paragraphs A1-A38, wherein the valve of the first aircraft is a gas valve.

A40. The method of any of paragraphs A1-A39, wherein the valve of the first aircraft is a flow control valve, and optionally wherein the valve of the first aircraft is a high temperature gaseous flow control valve of an environmental control system of the first aircraft.

A41. The method of any of paragraphs A1-A40, wherein the valve of the first aircraft is a shutoff valve, and optionally wherein the valve of the first aircraft is a high temperature gaseous shutoff valve of an environmental control system of the first aircraft.

A42. The method of any of paragraphs A1-A41, further comprising deploying the predictive model for valve performance to the fleet of aircraft.

A43. The method of any of paragraphs A1-A42, further comprising calculating a valve non-performance prediction of a subject valve of a subject aircraft based on the predictive model and flight data collected from a flight of the subject aircraft.

A43.1. The method of paragraph A43, further comprising collecting the flight data by flying the flight of the subject aircraft.

A44. The method of any of paragraphs A1-A43.1, further comprising determining an imminent valve non-performance condition of a subject valve of a subject aircraft based on the predictive model and flight data collected from a flight of the subject aircraft.

A44.1. The method of paragraph A44, further comprising collecting the flight data by flying the flight of the subject aircraft.

A44.2. The method of any of paragraphs A44-A44.1, further comprising repairing the subject valve of the subject aircraft after the determining.

A45. A computerized system comprising:
a computer-readable memory;
a processing unit operatively coupled to the computer-readable memory; and
a computer-readable storage media assemblage, wherein the storage media assemblage is operatively coupled to the computer-readable memory and includes instructions, that when executed by the processing unit, cause the system to perform the method of any of paragraphs A1-A41.

A46. A non-transitory computer-readable medium including instructions for causing a computer system to perform the method of any of paragraphs A1-A41.

B1. A hybrid feature selection system to generate a predictive model of valve performance in a fleet of aircraft, the hybrid feature selection system comprising:
a flight database of data collected during flights of aircraft of the fleet of aircraft;
a qualification module configured to retrieve qualification data from the flight database, configured to calculate a qualification dataset by applying valve-related parameters to the qualification data, configured to display the qualification dataset, and configured to receive, from a user, a selection of the valve-related parameters, wherein the qualification data is data collected during a first series of flights of a first aircraft at least before and after a non-performance event of a valve of the first aircraft;
a verification module configured to retrieve verification data from the flight database, configured to calculate a verification dataset by applying the selection of valve-related parameters to the verification data, configured to display the verification dataset, and configured to receive, from the user, a set of the selection of the valve-related parameters that is less than all of the valve-related parameters, wherein the verification data is data collected during a second series of flights of one of the first aircraft and a second aircraft of the fleet, during which the respective aircraft did not experience a non-performance event of a valve of the respective aircraft; and a training module configured to retrieve training data from the flight database, configured to calculate a training dataset by applying the set of the selection of valve-related parameters to the training data, configured to train a predictive model for non-performance with the training dataset, and configured to provide the predictive model to the user.

B2. The hybrid feature selection system of paragraph B1 programmed to perform the method of any of paragraphs A1-A41.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, the phrases "at least one of" and "one or more of," in reference to a list of more than one entity, means any one or more of the entities in the list of entities, and is not limited to at least one of each and every entity specifically listed within the list of entities. For example, "at least one of A and B" (or, equivalently, "at least one of A or B," or, equivalently, "at least one of A and/or B") may refer to A alone, B alone, or the combination of A and B.

As used herein, the singular forms "a", "an" and "the" may be intended to include the plural forms as well, unless the context clearly indicates otherwise.

The various disclosed elements of systems and steps of methods disclosed herein are not required of all systems, apparatuses, and methods according to the present disclosure, and the present disclosure includes all novel and non-obvious combinations and subcombinations of the various elements and steps disclosed herein. Moreover, any of the various elements and steps, or any combination of the various elements and/or steps, disclosed herein may define independent inventive subject matter that is separate and apart from the whole of a disclosed system, apparatus, or method. Accordingly, such inventive subject matter is not required to be associated with the specific systems, apparatuses, and methods that are expressly disclosed herein, and such inventive subject matter may find utility in systems, apparatuses, and/or methods that are not expressly disclosed herein.

The invention claimed is:

1. A method for creating a predictive model for valve performance in a fleet of aircraft using a hybrid feature selection system, the method comprising:
for a first aircraft of the fleet that experienced a non-performance event of a valve of the first aircraft during a first series of flights:
calculating, by a processing unit of a computerized system, a qualification dataset of valve-related parameters from data collected during the first series of flights at least before and after the non-performance event of the valve of the first aircraft;
displaying, by the processing unit, the qualification dataset on a graphical user interface associated with the computerized system; and
receiving, by the processing unit and via the graphical user interface, a first user selection that corresponds to a selection of the valve-related parameters;
for a second series of flights of one of the first aircraft and a second aircraft of the fleet, during which the respective aircraft did not experience a non-performance event of a valve of the respective aircraft, wherein the second series of flights has a number of flights that is the same as a number of flights of the first series of flights:
calculating, by the processing unit, a verification dataset of the selection of valve-related parameters from data collected during the second series of flights;
displaying, by the processing unit, the verification dataset on the graphical user interface associated with the computerized system; and
receiving, by the processing unit and via the graphical user interface, a second user selection that corresponds to a set of the selection of the valve-related parameters, wherein the set of the selection of the valve-related parameters is less than all of the valve-related parameters;
calculating, by the processing unit, a training dataset of the set of the selection of the valve-related parameters from data collected during additional flights of aircraft of the fleet; and
training, by the processing unit, a predictive model for valve performance with the training dataset.

2. The method of claim 1, wherein the second series of flights is a second series of flights of the first aircraft and wherein each of the flights of the second series of flights is different than each of the flights of the first series of flights.

3. The method of claim 1, wherein the qualification dataset includes data collected during the non-performance event.

4. The method of claim 1, wherein the valve-related parameters include a control loop parameter of a control loop that includes the valve of the first aircraft.

5. The method of claim 1, wherein the data collected during the first series of flights, the data collected during the second series of flights, and the data collected during the additional flights of aircraft of the fleet was captured on a periodic basis.

6. The method of claim 1, wherein the displaying the qualification dataset includes visualizing the qualification dataset and wherein the displaying the verification dataset includes visualizing the verification dataset.

7. The method of claim 1, wherein the displaying the qualification dataset includes displaying responsive to user inputs and wherein the displaying the verification dataset includes displaying responsive to user inputs.

8. The method of claim 1, wherein the training the predictive model includes applying machine learning to the training dataset.

9. The method of claim 1, wherein the selection of the valve-related parameters is less than all valve-related parameters.

10. The method of claim 1, wherein the set of the selection of the valve-related parameters is less than all of the selection of the valve-related parameters.

11. The method of claim 1, wherein the receiving the first user selection that corresponds to the selection of the valve-related parameters includes receiving, from a user, the selection of the valve-related parameters based on the user's determination of a correlation between the non-performance event and the valve-related parameters, and wherein the receiving the second user selection that corresponds to the set of the selection of the valve-related parameters includes receiving, from the user, the set of the selection of the valve-related parameters based on the user's determination of a lack of correlation between the selection of the valve-related parameters of the qualification dataset and the corresponding valve-related parameters of the verification dataset.

12. The method of claim 1, wherein the predictive model for valve performance is a predictive model for non-performance of an environmental control system valve of an aircraft environmental control system of a third aircraft, wherein the calculating the qualification dataset includes restricting the qualification dataset to the valve-related parameters from data collected when an aircraft environmental control system of the first aircraft is in a normal flight condition, wherein the calculating the verification dataset includes restricting the verification dataset to the valve-related parameters from data collected when an aircraft environmental control system of the respective aircraft is in the normal flight condition, wherein the calculating the training dataset includes restricting the training dataset to the valve-related parameters from data collected when the aircraft environmental control system of the third aircraft is in the normal flight condition, and wherein the normal flight condition includes at least one of an aircraft weight-off-wheels condition, an aircraft airspeed greater than a predetermined threshold, an active air-source input state, an engine compressor discharge pressure greater than a predetermined threshold, a valve input pressure greater than a predetermined threshold, and substantially equal engine throttle positions.

13. The method of claim 1, wherein the calculating the qualification dataset includes restricting the qualification dataset to the valve-related parameters from data collected when at least one of valve inputs and valve outputs are within a nominal range, wherein the calculating the verification dataset includes restricting the verification dataset to the valve-related parameters from data collected when at least one of valve inputs and valve outputs are within a nominal range, and wherein the calculating the training dataset includes restricting the training dataset to the valve-related parameters from data collected when at least one of valve inputs and valve outputs are within a nominal range.

14. The method of claim 1, wherein the predictive model for valve performance is a predictive model for non-performance of a high temperature gaseous flow control valve of an aircraft environmental control system, wherein the valve-related parameters include at least one of an average of a difference between a high temperature gaseous flow control valve output pressure and a high temperature gaseous flow control valve command value, a moving-window average of a difference between a high temperature gaseous shutoff valve output pressure and the high temperature gaseous flow control valve output pressure, and an average of the difference between the high temperature gaseous shutoff valve output pressure and the high temperature gaseous flow control valve output pressure.

15. The method of claim 1, wherein the predictive model for valve performance is a predictive model for non-performance of a high temperature gaseous flow control valve of an aircraft environmental control system, wherein the selection of valve-related parameters includes at least one of a count of high temperature gaseous flow control valve command values at a predetermined value, a minimum of a high temperature gaseous flow control valve output pressure, a maximum of the high temperature gaseous flow control valve output pressure, an average of the high temperature gaseous flow control valve output pressure, a variance of the high temperature gaseous flow control valve output pressure, a minimum of a downstream avionics flow, a maximum of the downstream avionics flow, an average of the downstream avionics flow, a variance of the downstream avionics flow, a maximum pressure drop across a downstream avionics venturi, a moving average of a difference of a high temperature gaseous shutoff valve output pressure and the high temperature gaseous flow control valve output pressure, an average of the difference of the high temperature gaseous shutoff valve output pressure and the high temperature gaseous flow control valve output pressure, an average of a downstream air cycle machine turbine input temperature, an average of a downstream air cycle machine compressor output temperature, an average of a difference of the high temperature gaseous flow control valve output pressure and a high temperature gaseous flow control valve position command value, an average of the high temperature gaseous flow control valve position command value, a minimum of the high temperature gaseous shutoff valve output pressure, a maximum of the high temperature gaseous shutoff valve output pressure, an average of the high temperature gaseous shutoff valve output pressure, and a variance of the high temperature gaseous shutoff valve output pressure.

16. The method of claim 1, wherein the predictive model for valve performance is a predictive model for non-performance of a high temperature gaseous shutoff valve of an aircraft environmental control system, wherein the valve-related parameters include at least one of a moving-window average of a high temperature gaseous shutoff valve input pressure and a moving-window sum of a closure rate of the high temperature gaseous shutoff valve of the first aircraft.

17. The method of claim 1, wherein the predictive model for valve performance is a predictive model for non-performance of a high temperature gaseous shutoff valve of an aircraft environmental control system, wherein the selection of the valve-related parameters includes at least one of an average of a moving-window sum of instances that the high temperature gaseous shutoff valve of the respective aircraft was closed when a high temperature gaseous shutoff valve output pressure was within a nominal range, a maximum of the moving-window sum of instances that the high temperature gaseous shutoff valve of the respective aircraft was closed when the high temperature gaseous shutoff valve output pressure was within a nominal range, a minimum of the moving-window sum of instances that the high temperature gaseous shutoff valve of the respective aircraft was closed when the high temperature gaseous shutoff valve output pressure was within a nominal range, a maximum continuous time the high temperature gaseous shutoff valve of the respective aircraft was closed, an average of the high temperature gaseous shutoff valve output pressure, a total amount of time the high temperature gaseous shutoff valve of the respective aircraft was closed, an average of the high temperature gaseous shutoff valve output pressure when below a predetermined lower limit, an average of the high temperature gaseous shutoff valve output pressure when above a predetermined upper limit, a total number of instances the high temperature gaseous shutoff valve transitioned from open to closed, a maximum one second change in the high temperature gaseous shutoff valve output pressure when the high temperature gaseous shutoff valve output pressure is below a predetermined lower limit, a maximum of the high temperature gaseous shutoff valve output pressure, a minimum of the high temperature gaseous shutoff valve output pressure, a maximum one second change in the high temperature gaseous shutoff valve output when the high temperature gaseous shutoff valve output pressure is above a predetermined upper limit, a variance of a high temperature gaseous shutoff valve input pressure, and a variance of the high temperature gaseous shutoff valve output pressure.

18. The method of claim 1, further comprising determining an imminent valve non-performance condition of a subject valve of a subject aircraft based on the predictive model and flight data collected from a flight of the subject aircraft, and the method further comprising repairing the subject valve of the subject aircraft after the determining.

19. A hybrid feature selection system to generate a predictive model of valve performance in a fleet of aircraft, the hybrid feature selection system comprising:
 at least one processing unit;
 a memory storing:
  a flight database of data collected during flights of aircraft of the fleet of aircraft; and
  non-transitory computer readable instructions that, when executed by the at least one processing unit, cause the at least one processing unit to:
   retrieve qualification data from the flight database;
   calculate a qualification dataset by applying valve-related parameters to the qualification data;
   display the qualification dataset on a graphical user interface associated with the at least one processing unit;
   receive, from a user and via the graphical user interface, a first user selection that corresponds to a selection of the valve-related parameters, wherein the qualification data is data collected during a first series of flights of a first aircraft at least before and after a non-performance event of a valve of the first aircraft;
   retrieve verification data from the flight database;
   calculate a verification dataset by applying the selection of valve-related parameters to the verification data;
   display the verification dataset on the graphical user interface associated with the at least one processing unit;
   receive, from the user and via the graphical user interface, a second user selection that corresponds to a set of the selection of the valve-related parameters that is less than all of the valve-related parameters, wherein the verification data is data collected during a second series of flights of one of the first aircraft and a second aircraft of the fleet, during which the respective aircraft did not experience a non-performance event of a valve of the respective aircraft;

retrieve training data from the flight database;

calculate a training dataset by applying the set of the selection of valve-related parameters to the training data;

train a predictive model for valve performance with the training dataset; and provide the predictive model to the user.

20. The method of claim 1, further comprising:

collecting, by the processing unit, flight data by conducting a flight of a subject aircraft;

calculating, by the processing unit, a valve non-performance prediction of a subject valve of the subject aircraft based on the predictive model and the flight data collected from the flight of the subject aircraft; and transmitting, by the processing unit, a notification signal to a health management system associated with the subject aircraft, wherein the notification signal indicates the valve non-performance prediction, and the health management system is configured to update a maintenance schedule based on the notification signal.

21. A method for creating a predictive model for valve performance in a fleet of aircraft, the method comprising:

for a first aircraft of the fleet that experienced a non-performance event of a valve of the first aircraft during a first series of flights:

calculating, by a processing unit of a computerized system, a qualification dataset of valve-related parameters from data collected during the first series of flights at least before and after the non-performance event of the valve of the first aircraft; and identifying a first set of valve-related parameters from the qualification dataset of valve-related parameters that correlate to valve non-performance;

for a second series of flights of one of the first aircraft and a second aircraft of the fleet, during which the respective aircraft did not experience a non-performance event of a valve of the respective aircraft:

calculating, by the processing unit, a verification dataset of the first set of valve-related parameters from data collected during the second series of flights; and identifying from the first set of valve-related parameters, a second set of valve-related parameters that contains fewer valve-related parameters than the first set of valve-related parameters;

calculating, by the processing unit, a training dataset of the second set of the valve-related parameters from data collected during additional flights of aircraft of the fleet; and training, by the processing unit, a predictive model for valve performance with the training dataset.

* * * * *